United States Patent [19]

Cukier

[11] 4,237,542
[45] Dec. 2, 1980

[54] PROGRAMMABLE LOGIC ARRAYS

[75] Inventor: Maurice Cukier, Vence, France

[73] Assignee: International Business Machines Corporation, Armonk, N.Y.

[21] Appl. No.: 901,166

[22] Filed: Apr. 28, 1978

[30] Foreign Application Priority Data

Jun. 30, 1977 [FR] France ................... 77 20729

[51] Int. Cl.³ .................... G06F 9/00; G06F 7/48
[52] U.S. Cl. .............................. 364/900; 364/716
[58] Field of Search ............... 340/166, 147 P, 147 R; 307/88 LC; 364/716, 200 MS File, 900 MS File

[56] References Cited

U.S. PATENT DOCUMENTS

| | | | |
|---|---|---|---|
| 3,230,355 | 1/1966 | Chu | 364/716 |
| 3,987,287 | 12/1974 | Cox et al. | 364/712 |
| 4,037,089 | 7/1977 | Horninger | 364/900 X |
| 4,041,459 | 8/1977 | Horninger | 340/166 R |
| 4,114,143 | 9/1978 | Karnaugh | 340/147 R X |
| 4,132,979 | 1/1979 | Heeren | 364/900 X |

OTHER PUBLICATIONS

Carr et al., *MOS/LSI Design and Application*, Chapter 8, 1972, McGraw-Hill Book Company, Texas Instruments Electronics Series.
MOS Programmable Logic Arrays-Kent Andres-Texas Instruments Application Reports-No. CA 158-10/70-pp. 1-4.
Programmable Logic Arrays-Mitchell-Electronic Design 15, Jul. 19, 1976-pp. 98-101 (Thomas W. Mitchell).

*Primary Examiner*—Harvey E. Springborn
*Attorney, Agent, or Firm*—James E. Murray

[57] ABSTRACT

A programmable logic array (PLA) is provided with a plurality of storage registers. The PLA includes an AND matrix which generates inputs to an OR matrix which in turn selectively feeds output signals into the storage registers. At a selected time, a selected storage register provides the output signals of the PLA and/or feedback signals to the AND array so that sequential logic functions can be performed in the PLA. The plurality of storage registers are used to store various combinations of the OR matrix output signals. A decoder permits selection of one of the registers at a time to allow time discrimination among the various stored combinations of the OR matrix output signals for the purposes of feeding them out of the PLA and/or feeding them back into the AND matrix.

5 Claims, 5 Drawing Figures

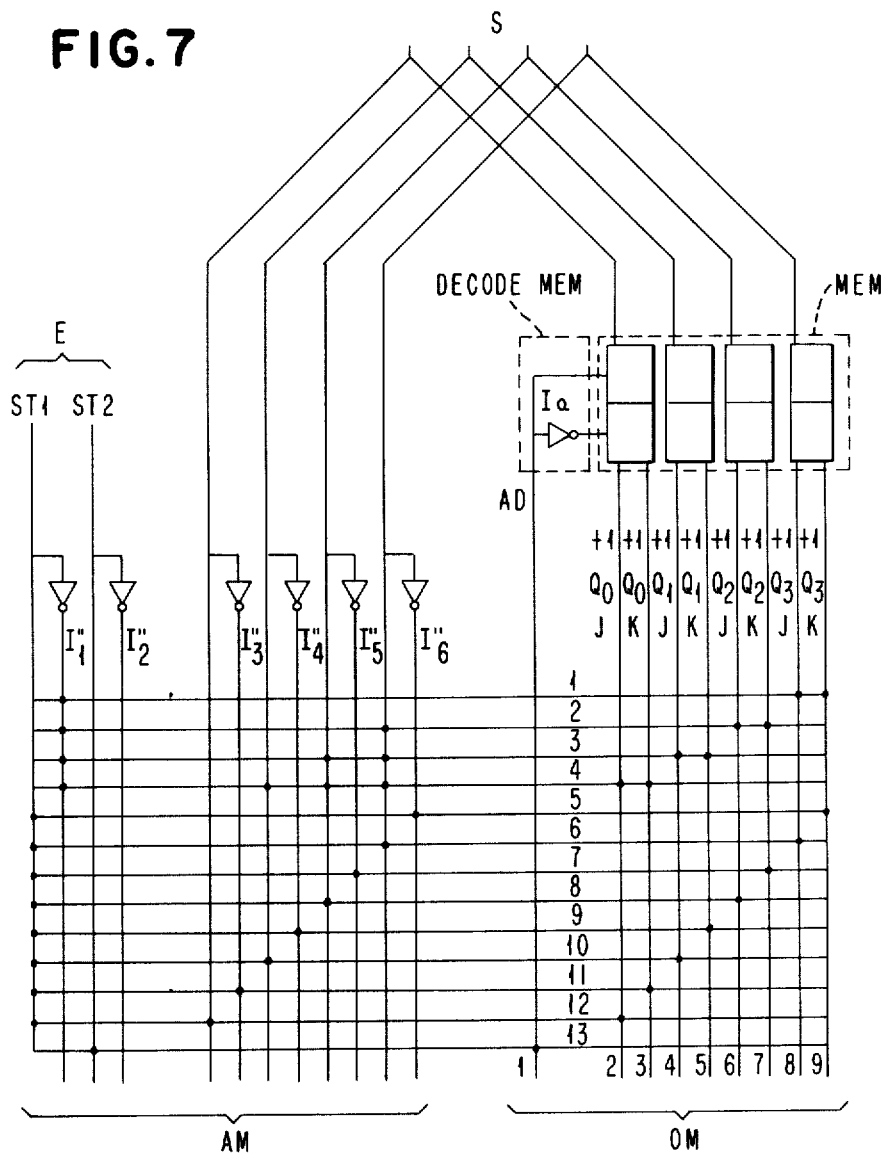

PROGRAMMABLE LOGIC ARRAYS

BACKGROUND OF THE INVENTION

This invention relates to an improvement in the technique of implementing circuits which make use of programmable logic arrays (PLA) and, more particularly, to those PLA circuits which are intended to fulfill functions involving recurrent processes.

It is a well-known fact that any complex logic function results from the combination of basic functions which, more particularly, make use of AND and OR functions. Bearing that in mind and taking advantage of the progress of the large scale integrated circuit technique, the manufacturers have conceived and put on the market new types of circuits, the so-called PLA's which are essentially comprised of matrices of elements fulfilling the OR and AND functions. The simplest of these circuits includes an AND matrix formed of AND circuits and an OR matrix formed of OR circuits. The inputs of the data to be processed is generally provided to the AND matrix. This matrix makes AND-type logic combinations involving the input data and the inverses (or complements) thereof. The terms issuing from this first matrix are then introduced into the OR matrix wherein they are subject to OR-type logic operations. In some applications, the desired result is, then, obtained at the output of this second matrix. But some other applications necessitate recurrent operations. In other words, the information appearing at the output of the OR matrix must be fed back into the input of the AND matrix. The final result is obtained after the carrying out of a sequential process wherein some steps involve results obtained during the execution of the immediately preceding step. In order to fulfill these functions, a buffer register or other storage means is provided at the output of the OR matrix and the output of this register is connected to the input of the AND matrix. When the operations are more complex, it may be necessary to preserve the results relative to several steps in order to be able to reintroduce them into the circuit at different given time-instants. It results therefrom that a plurality of buffer registers are necessary, and worse, the sizes of the AND and OR matrices have to be increased when conventional techniques are used.

DESCRIPTION

In accordance with the present invention a programmable logic array is provided with a plurality of word or storage registers in which various combinations of OR outputs can be stored. A decoder is used to read out the contents of these registers one at a time to time discriminate among various stored combinations of OR outputs for the purposes of feeding such stored combinations out of the PLA or for feeding them back into the AND matrix at different times.

BRIEF DESCRIPTION OF THE DRAWINGS

This invention will be further disclosed, by way of a non-limitative example, with referece to the accompanying drawings, in which:

FIGS. 6 and 7 show a PLA for performing the decoding and selection functions illustrated in FIG. 4 to show another embodiment of the present invention.

DETAILED DESCRIPTION

Figure 4:
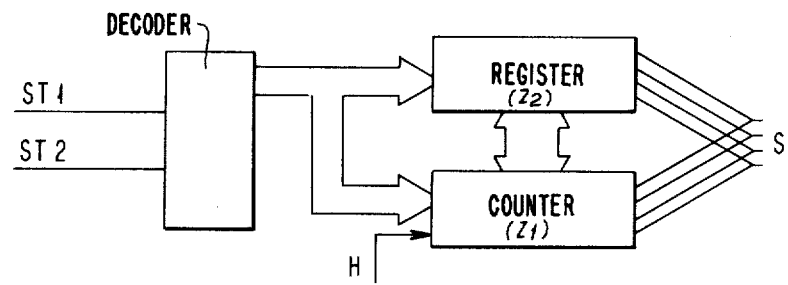
FIG. 4 is a block diagram of the decoding and plural register elements for use with a PLA as used in the present invention.

For a better understanding of what a programmable logic array is, reference should be made to Mssrs. William N. Carr and Jack P. Mize's book entitled "MOS/LSI Design and Application" published by McGraw-Hill Book Company in 1972 in the Texas Instruments Electronics series. In Chapter 8, FIGS. 8-4 illustrates basic elements of a two-matrix array having one matrix comprised of AND circuits, the other one being comprised of OR circuits, and one feedback loop through a buffer register. Also in Chapter 8 of this book are some examples of implementations of programmable logic arrays.

Figure 1:
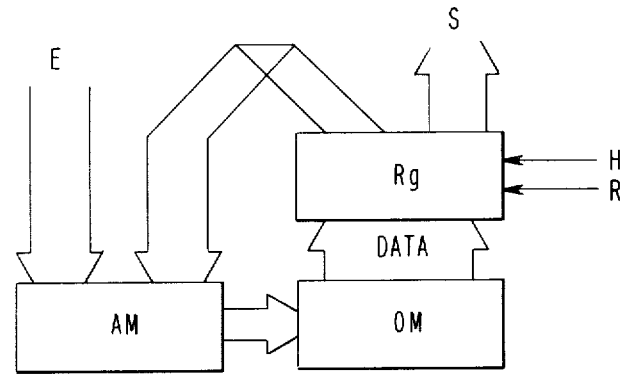
FIGS. 1 and 2 are block diagrams of the prior art programmable logic arrays.

FIG. 1 of the present invention illustrates the essential elements of a recurrent-type programmable logic array, namely an AND matrix AM comprised of AND circuits which receives the input logic signals at input E. The outputs of matrix AM are fed into matrix OM comprised OR circuits. The digital data representative of the desirable results are taken at the output of matrix OM either directly or through a storage means in the form of a parallel-in parallel-out register Rg. This register is utilized as a whole or partly in order to store the data to be reinjected into matrix AM through a feedback loop. Clock signals (H) and in certain cases restore signals (R), in addition, are provided for controlling the operations.

With this scheme it is possible to implement a device intended to carry out the sequential and recurrent operations through which the contents stored in register Rg during one step are utilized in the following step.

For some more complex logic functions, it is necessary to have several buffer registers so that the data in the feedback loop can be modified throughout the operation. For instance, it may be desirable to have the result supplied by matrix OM through a previous and predetermined clock cycle, introduced into the feedback loop under predefined logic conditions. As compared to FIG. 1, several registers need, then, be used, i.e. as many registers Rg as there are different data elements to be stored through the sequential operating process for the carrying out of the desired complex logic function. But, unfortunately, the size of the AND and OR matrices must be increased considerably, as shown in FIG. 2.

Figure 2:
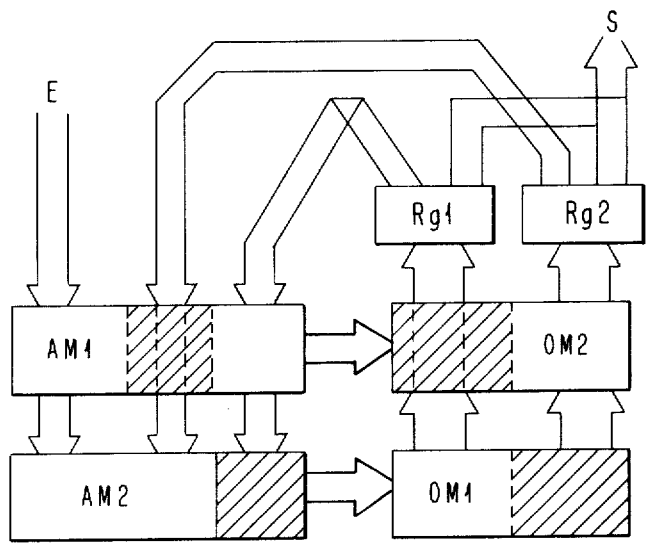

FIG. 2 illustrates a two-buffer register programmable logic array, using prior art techniques. It should be noted that the sizes of the AND and OR matrices have been enlarged. Input E receives data and/or control elements of information which drive the two AND matrices AM1 and AM2. The outputs from AM1 and AM2 are sent to the inputs of OR matrices OM1 and OM2, respectively, which feed a feedback loop, through buffer registers Rg1 or Rg2, respectively. The outputs S of the array are taken from these registers. It should be noted that matrices AM1 and AM2 can be gathered into a single matrix. The same holds true for matrices OM1 and OM2. As shown in FIG. 2, AND and OR matrices AM1, AM2, OM1, OM2 include unused zones (hatched zones) but which however exist, thereby explaining the increase in size of these matrices with respect to the number of the registers. The reason why these zones exist will appear from the description in reference to FIG. 5.

This increase in the number of the circuits has repercussions not only on the price of the so-implemented device, but also on the volume thereof which is increased accordingly, and this, essentially because of the increase of the number of input-output pins and connecting lines between the elements of integrated circuits used.

Figure 3:
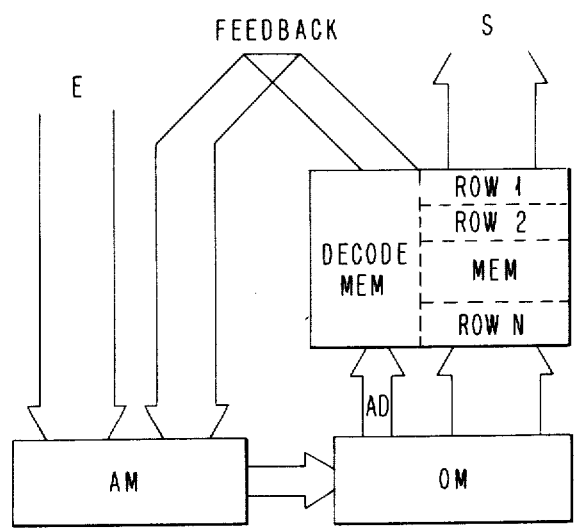
FIG. 3 is a block diagram of a PLA illustrating one embodiment of the present invention.

It is suggested, here, that these drawbacks may be overcome by means of the device shown in FIG. 3. This figure illustrates the matrices AM and OM which are similar to those shown in FIG. 1. But, here, matrix OM is provided with an address zone AD which supplies an output which carries the so-called address information. This output is used to address the different word positions (which are arranged in rows in the chosen example) of a storage means which in this embodiment is a random access memory matrix with a plurality of word positions MEM, through a decoding circuit DECODE MEM. This programmable logic device, therefore, has as many parallel-mounted registers, similar to Rg, as there are rows in memory MEM. This number of rows will be a function of the number of the intermediate storage operations involved in the carrying out of the complex logic function for which the programmable logic array (PLA) has been conceived. The input E of the device will receive the data bits and/or the status control bits which will be defined further on.

It should be noted that the diagram shown in FIG. 3 is very much schematic and that what has been referred to as a complex logic function may actually result from the combination of a plurality of functions either simple or complex, as further illustrated with the help of an example.

In order to make the invention more clear, it will now be illustrated as applied to a specific application, say, a digital timer. This timer comprises a modulo-16 binary counter $Z_1$ clocked by a signal (H), and with its contents being able to be displayed in a register $Z_2$, upon request. As shown in FIG. 4, the operating status of the timer is controlled by a decoding circuit DEC the input of which receives two status control bits ST1 and ST2. The combination of these two bits defines the order given to the timer, according to the following Table 1.

TABLE 1

| ST1 | ST2 | OPERATION |
| --- | --- | --- |
| 0 | 0 | Clock-operate (counter) (Z1) |
| 0 | 1 | Transfer the counter contents into Z2 |
| 1 | 0 | Recirculate the contents of Z1 |
| 1 | 1 | Recirculate the contents of Z2 |

Since the counter is modulo-16 operated, it must count from 0 to 15 in the decimal form, therefore, it must have four binary stages. When it operates as a clock, each operating step prepares the following one. If, during any operating cycle, the contents of one of the stages is designated by Q, the contents $Q^{+1}$ of this very stage during the following cycle can then be easily deduced therefrom. The relations between Q and $Q^{+1}$ are shown in the following Table 2.

TABLE 2

| $Q_0$ | $Q_1$ | $Q_2$ | $Q_3$ | $Q_0^{+1}$ | $Q_1^{+1}$ | $Q_2^{+1}$ | $Q_3^{+1}$ |
| --- | --- | --- | --- | --- | --- | --- | --- |
| 0 | 0 | 0 | 0 | 0 | 0 | 0 | 1 |
| 0 | 0 | 0 | 1 | 0 | 0 | 1 | 0 |
| 0 | 0 | 1 | 0 | 0 | 0 | 1 | 1 |
| 0 | 0 | 1 | 1 | 0 | 1 | 0 | 0 |
| 0 | 1 | 0 | 0 | 0 | 1 | 0 | 1 |
| 0 | 1 | 0 | 1 | 0 | 1 | 1 | 0 |
| 0 | 1 | 1 | 0 | 0 | 1 | 1 | 1 |
| 0 | 1 | 1 | 1 | 1 | 0 | 0 | 0 |
| 1 | 0 | 0 | 0 | 1 | 0 | 0 | 1 |
| 1 | 0 | 0 | 1 | 1 | 0 | 1 | 0 |
| 1 | 0 | 1 | 0 | 1 | 0 | 1 | 1 |
| 1 | 0 | 1 | 1 | 1 | 1 | 0 | 0 |
| 1 | 1 | 0 | 0 | 1 | 1 | 0 | 1 |
| 1 | 1 | 0 | 1 | 1 | 1 | 1 | 0 |
| 1 | 1 | 1 | 0 | 1 | 1 | 1 | 1 |
| 1 | 1 | 1 | 1 | 0 | 0 | 0 | 0 |

It results therefrom the following logic relations:

$$Q_0^{+1} = \overline{Q_0}Q_1Q_2Q_3 + Q_0\overline{Q_1Q_2Q_3} + \\ Q_0\overline{Q_1}\overline{Q_2}Q_3 + Q_0\overline{Q_1}Q_2\overline{Q_3} + \\ Q_0\overline{Q_1}Q_2Q_3 + Q_0Q_1\overline{Q_2}\overline{Q_3} + \\ Q_0Q_1\overline{Q_2}Q_3 + Q_0Q_1Q_2\overline{Q_3}$$

$$Q_1^{+1} = \overline{Q_0}\overline{Q_1}Q_2Q_3 + \overline{Q_0}Q_1\overline{Q_2Q_3} + \\ \overline{Q_0}Q_1\overline{Q_2}Q_3 + \overline{Q_0}Q_1Q_2\overline{Q_3} + \\ Q_0\overline{Q_1}Q_2Q_3 + Q_0Q_1\overline{Q_2Q_3} + \\ Q_0Q_1\overline{Q_2}Q_3 + Q_0Q_1Q_2\overline{Q_3}$$

$$Q_2^{+1} = \overline{Q_0Q_1Q_2}Q_3 + \overline{Q_0Q_1}Q_2\overline{Q_3} + \\ \overline{Q_0}Q_1\overline{Q_2}Q_3 + \overline{Q_0}Q_1Q_2\overline{Q_3} + \\ Q_0\overline{Q_1Q_2}Q_3 + Q_0\overline{Q_1}Q_2\overline{Q_3} + \\ Q_0Q_1\overline{Q_2}Q_3 + Q_0Q_1Q_2\overline{Q_3}$$

$$Q_3^{+1} = \overline{Q_0Q_1Q_2Q_3} + \overline{Q_0}Q_1Q_2\overline{Q_3} + \\ \overline{Q_0}Q_1\overline{Q_2Q_3} + \overline{Q_0}Q_1Q_2\overline{Q_3} + \\ Q_0\overline{Q_1Q_2Q_3} + Q_0\overline{Q_1}Q_2\overline{Q_3} + \\ Q_0Q_1\overline{Q_2Q_3} + Q_0Q_1Q_2\overline{Q_3}$$

When simplifying the above expressions with the help of the so-called Karnaugh diagrams, there is obtained:

$$Q_0^{+1} = \overline{Q_0}Q_1Q_2Q_3 + Q_0\overline{Q_1} + Q_0\overline{Q_2} + Q_0\overline{Q_3}$$

$$Q_1^{+1} = Q_1\overline{Q_3} + Q_1\overline{Q_2} + \overline{Q_1}Q_2Q_3$$

$$Q_2^{+1} = Q_2\overline{Q_3} + \overline{Q_2}Q_3$$

$$Q_3^{+1} = \overline{Q_3}$$

Figure 5:
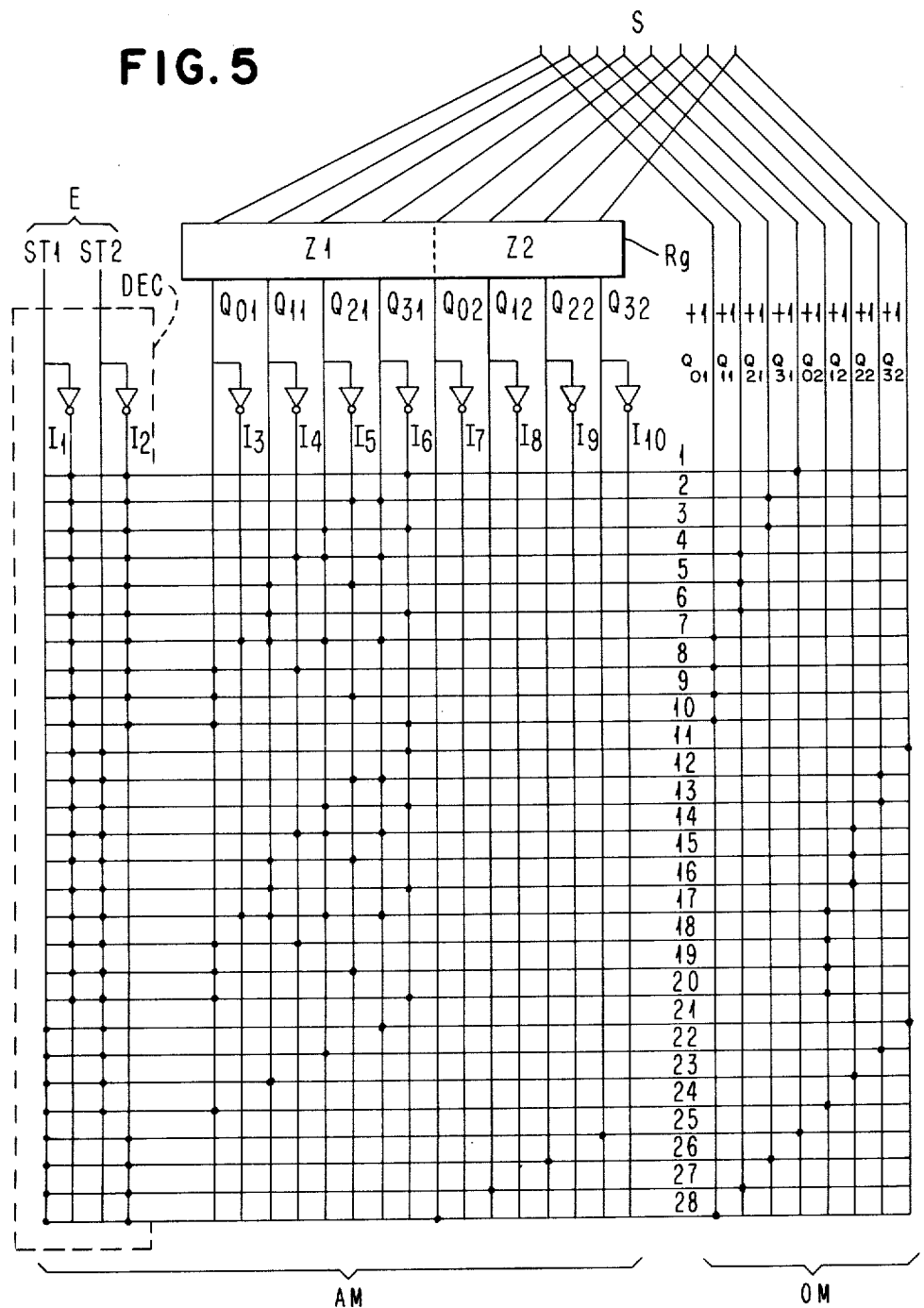
FIG. 5 shows a PLA for performing the decoding and selection functions illustrated in FIG. 4 using prior art techniques.

FIG. 5 is a schematic diagram of the timer implemented by making use of the prior art PLA techniques. This device is comprised of a twenty-column AND matrix, an eight-column OR matrix, an eight-position register Rg (four positions for register Z1 normally belonging to the counter feedback loop, the other four positions are for the additional register Z2) and ten inverting circuits $I_1$ through $I_{10}$. Four columns in matrix AM are reserved for the decoding circuit DEC fulfilling the logic functions namely, $\overline{ST_1}\cdot\overline{ST_2}=1$ for the ten upper lines of the array, $\overline{ST_1}\cdot ST_2=1$ for the ten following lines (lines 11-20), $ST_1\cdot\overline{ST_2}=1$ for lines 21 through 24 and $ST_1\cdot\overline{ST_2}=1$ for lines 25 through 28.

The other sixteen columns in matrix AM which are associated with matrix OM and register Rg are used to build register Z2 and the counter (including register Z1) shown in FIG. 4. The outputs of register Z1 have been designated by $Q_{01}$, $Q_{11}$, $Q_{21}$ and $Q_{31}$ and the outputs of register Z2 have been designated by $Q_{02}$, $Q_{12}$, $Q_{22}$ and $Q_{32}$. When adopting similar notations, the outputs of matrix OM are designated by $Q_{01}^{+1}$, $Q_{11}^{+1}$, $Q_{31}^{+1}$, $Q_{02}^{+1}$, $Q_{12}^{+1}$, $Q_{22}^{+1}$ et $Q_{32}^{+1}$.

The ten higher lines in matrix AM which are made active when $ST_1=0$ and $ST_2=0$, respectively supply the logic functions. Starting with the upper line, these functions are given in the following Table 3.

TABLE 3

| Line | Function |
|---|---|
| 1 | $\overline{Q_{31}}$ |
| 2 | $\overline{Q_{21}} \cdot Q_{31}$ |
| 3 | $Q_{21} \cdot \overline{Q_{31}}$ |
| 4 | $\overline{Q_{11}} \cdot Q_{21} \cdot Q_{31}$ |
| 5 | $Q_{11} \cdot \overline{Q_{21}}$ |
| 6 | $Q_{11} \cdot \overline{Q_{31}}$ |
| 7 | $\overline{Q_{01}} \cdot Q_{11} \cdot Q_{21} \cdot Q_{31}$ |
| 8 | $\overline{Q_{01}} \cdot \overline{Q_{11}}$ |
| 9 | $Q_{01} \cdot \overline{Q_{21}}$ |
| 10 | $Q_{01} \cdot \overline{Q_{31}}$ |

The left-hand column in matrix OM fulfills the OR logic function upon lines 7, 8, 9 and 10 issuing from matrix AM. Therefore, it supplies $Q_{01}^{+1}$. The following column which operates upon lines 4, 5 and 6 in the same manner, supplies $Q_{11}^{+1}$. The third column which operates upon lines 2 and 3 supplies $Q_{21}^{+1}$. Finally, the fourth column which operates upon line 1, only, supplies $Q_{31}^{+1}$.

Since the above-mentioned lines 1 through 10 are the only active lines when the inputs of decoder DEC are both zero, the array duly operates according to the principles of a clock with a feedback through Z1, as shown in reference to Table 1.

The logic functions fulfilled upon lines 11 through 20 in matrix AM, which are selected when $ST_1=0$ and $ST_2=1$, are identical with those fulfilled upon lines 1 through 10, respectively. Besides, the four right-hand columns in matrix OM fulfill respectively the same functions upon lines 11 through 20 as those fulfilled by the four left-hand columns in matrix OM upon the contents in lines 1 through 10. Here also, it results that the array is clock-operated, i.e., it increments the contents of Z1 by one unit but the result is stored into Z2.

The figure clearly shows that when $ST_1=ST_2=1$, the contents in Z2 is recirculated through the array, without being altered, whereas when $ST_1=1$ and $ST_2=0$, it is the contents in Z1 which is recirculated unchanged.

Figure 6:
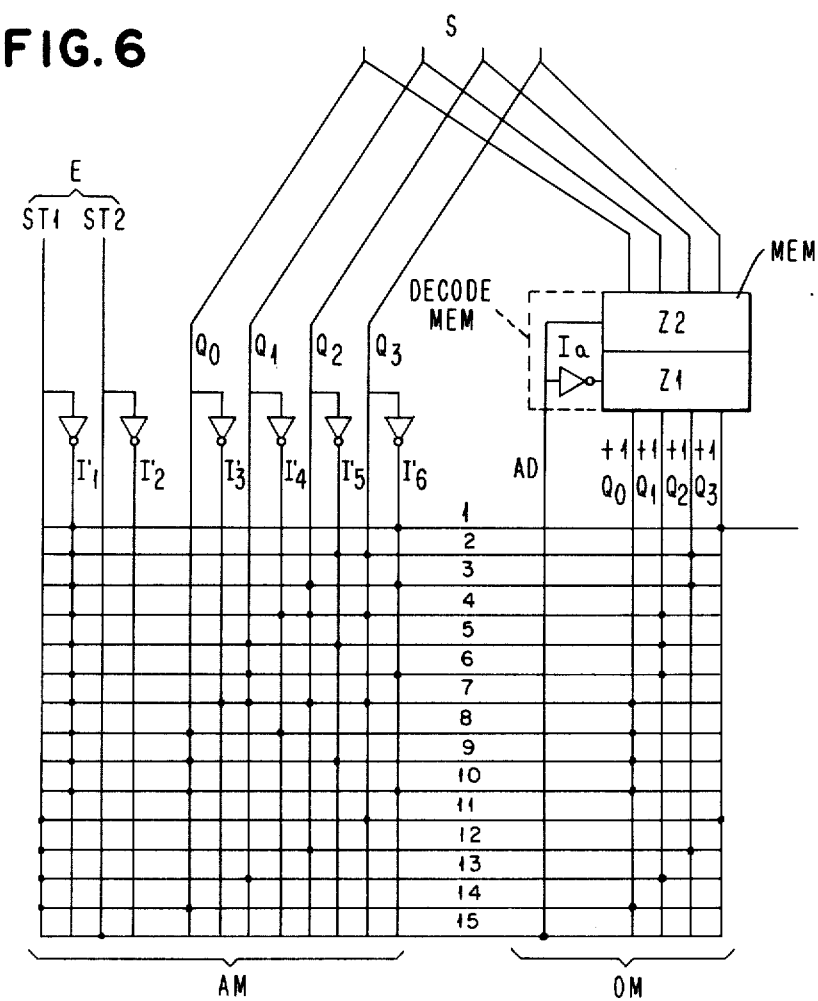

In brief, it can be stated that, when applying the known techniques for implementing the timer chosen to illustrate the invention, a relatively bulky programmable logic array has to be utilized. The circuits become far more simple when making use of the techniques according to this invention, as shown in FIG. 6. In this figure, the matrices AM and OM are comprised of 15 lines, the first one having only 12 columns and the second one, five. Memory MEM is comprised of two parallel-mounted storage registers Z1 and Z2. The decoding device DEC MEM is comprised of one inverter $I_a$ and one addressing line AD, only. The ten upper lines of matrix assembly AM and OM fulfill the same logic functions as lines 1 through 10 in FIG. 5, when excluding the decoding portion DEC (which makes use of four columns in the AND matrix). These functions enable the device to operate as a counter when the status control input ST1 is reset to zero ($ST1=0$), whatever be the logic level at input ST2. But when $ST2=0$, the addressing line AD is also reset to zero. The output of inverter $I_a$ of device DECODE MEM is set to 1. The addressed memory portion MEM, therefore, is Z1. The array is clock-operated with register Z1 being utilized in the feedback loop. When $ST2=1$, DECODE MEM addresses Z2. In that case, the contents in Z1, which recirculates through the array with its being incremented by one unit, is transferred into register Z2. When $ST1=1$, the counter is blocked and the data contained in the register addressed by DECODE MEM recirculate through the array. As seen above, when $ST2=1$, Z2 is addressed in order to receive the data which are recirculated whereas when $ST2=0$, Z1 is addressed instead. Thus, with this invention, the array shown in FIG. 6 fulfills the same logic functions as those fulfilled by the array shown in FIG. 4 while being considerably less bulky than the latter.

It should be noted that, in the chosen example, input E of the programmable array receives status control inputs, only. It is obvious that this will not be necessarily the case in all applications. In other words, input E is intended to receive data bits and/or control bits.

In addition, through memory MEM has been assimilated to a conventional random access memory, i.e., it is a memory formed of one-input bistable cells, this invention applies also to other types of memories. More specifically, two-input latch memories (J-K or R-S latches, or even sample and hold circuits) or three-input latch memories (RST latches) can be chosen. It results therefrom that, in some cases, the entire programmable logic array may be simplified. Thus, when making use of R-S latches in the timer chosen to illustrate the invention, Z1 or Z2 could be cleared without causing the data to be recirculated through the entire logic array.

FIG. 7 illustrates the same timer as the one previously described but, here, memory MEM is formed of two-input J-K latches, one input being designated by J, the other one, by K.

The truth table of a J-K latch can be summarized as follows:

| Inputs | | Contents | | |
|---|---|---|---|---|
| J | K | Q | Q | Function |
| 1 | 0 | X | 1 | Latch set to 1, independently of the previous contents |
| 0 | 1 | X | 0 | Latch rest to 0, independently of the previous contents |
| 1 | 1 | 0 | 1 | Latch contents changed |
| 1 | 1 | 1 | 0 | |
| 0 | 0 | 0 | 0 | Latch contents unchanged |
| 0 | 0 | 1 | 1 | |

The logic functions carried out on the lines of matrix AM numbered from top to bottom are summarized in the following Table 4.

TABLE 4

| Line | Function |
|---|---|
| 1 | $\overline{ST_1}$ |
| 2 | $\overline{ST_1} \cdot Q_3$ |

TABLE 4-continued

| Line | Function |
|---|---|
| 3 | $\overline{ST_1} \cdot Q_2 \cdot Q_3$ |
| 4 | $\overline{ST_1} \cdot Q_1 \cdot Q_2 \cdot Q_3$ |
| 5 | $ST_1 \cdot \overline{Q_3}$ |
| 6 | $ST_1 \cdot Q_3$ |
| 7 | $ST_1 \cdot \overline{Q_2}$ |
| 8 | $ST_1 \cdot Q_2$ |
| 9 | $ST_1 \cdot \overline{Q_1}$ |
| 10 | $ST_1 \cdot Q_1$ |
| 11 | $ST_1 \cdot \overline{Q_0}$ |
| 12 | $ST_1 \cdot Q_0$ |
| 13 | $ST_2$ |

The columns in matrix OM supply address AD and the inputs to the J-K latches. The logic functions carried out on these columns, which are numbered from left to right, are summarized in the following Table 5.

TABLE 5

| Column | Latch input | Function |
|---|---|---|
| 1 | AD | $ST_2$ |
| 2 | $Q_0^{+1}$, J | $ST_1 \cdot Q_0 + \overline{ST_1} \cdot Q_1 \cdot Q_2 \cdot Q_3$ |
| 3 | $Q_0^{+1}$, K | $ST_1 \cdot \overline{Q_0} + \overline{ST_1} \cdot Q_1 \cdot Q_2 \cdot Q_3$ |
| 4 | $Q_1^{+1}$, J | $ST_1 \cdot Q_1 + \overline{ST_1} \cdot Q_2 \cdot Q_3$ |
| 5 | $Q_1^{+1}$, K | $ST_1 \cdot \overline{Q_1} + \overline{ST_1} \cdot Q_2 \cdot Q_3$ |
| 6 | $Q_2^{+1}$, J | $ST_1 \cdot Q_2 + \overline{ST_1} \cdot Q_3$ |
| 7 | $Q_2^{+1}$, K | $ST_1 \cdot \overline{Q_2} + \overline{ST_1} \cdot Q_3$ |
| 8 | $Q_3^{+1}$, J | $ST_1 \cdot Q_3 + \overline{ST_1}$ |
| 9 | $Q_3^{+1}$, K | $ST_1 \cdot \overline{Q_3} \cdot \overline{ST_1}$ |

The matrix array shown in FIG. 7 is comprised of thirteen lines and nine columns; it is, therefore, somewhat less efficient than the array of FIG. 6. This essentially depends on the chosen type of application. But in some other cases, the devices which make use of multiple-input memory cells will be more advantageous than those making use of one-input cells.

Furthermore, it is obvious that this invention applies to the so-called programmable logic array having more than one AND or OR matrix array, as the PLA of the type disclosed in Cox et al U.S. Pat. No. 3,987,287 filed on Dec. 30, 1974 under the title: "High Density Logic Array".

From the description of the preferred embodiment of the invention one skilled in the art will recognize a variety of applications for the invention and appropriate modifications within the scope of the claims.

Having thus described my invention, what I claim as new, and desire to secure by Letters Patent is:

1. In a programmable logic array of the type which includes an AND matrix of logic performing elements generating inputs to an OR matrix of logic performing elements which in turn feeds output signals generated from said inputs into a storage means on a set of output lines for storing said output signals and for supplying said output signals as inputs to the AND array, the improvement comprising:

said storage means having n separately accessed registers each of which is connected to said set of output lines for receipt of output signals on said set of output lines by each of the registers; and decoding circuit coupled to said storage means for supplying different combinations of said output Signals as inputs to said AND array in different time segments by selecting a different one of said locations in said storage means during each such time segment.

2. A programmable logic array according to claim 1, wherein said decoding circuit means includes logic performing elements in said AND and OR matrix arrays.

3. A programmable logic array which includes:

input terminals, application means for applying data and control information to said input terminals, an AND matrix of logic performing elements having a first and second group of inputs said first group of inputs being connected to said input terminals for receipt of said data and control information for transmission of modified data and control information, an OR matrix of logic performing elements with inputs which are connected to the ouputs of said AND matrix and outputs for transmission of modified data and control information, a random access matrix memory formed of n registers each with inputs which are connected to the outputs of the OR array carrying modified data information so that each of the n registers can receive modified data information from the same outputs as the other of the n registers, address means for individually addressing each of said registers in said matrix memory said address means having inputs which are connected to the outputs of the OR array which carry modified control information for selection of one of the registers at a time, output terminals connected to said matrix memory to receive modified data information stored in a register selected by the address means; and a feedback loop connecting at least part of said output terminals to said second group of inputs of said AND matrix array.

4. A programmable logic array according to claim 3, wherein said registers of said random access matrix memory are each comprised of a number of bistable circuits each having at least two inputs.

5. In a programmable logic array device of the type having AND matrix means of logic performing elements feeding input signals to OR matrix means of logic performing elements which in turn feed output signals supplied on a set of output lines to said AND matrix means in a feedback loop between said OR matrix means and said AND matrix means said feedback loop containing storage means to store the output signals supplied on said set of output lines so that sequential logic can be performed by the programmable logic array, the improvement comprising:

said storage means being a random access memory with a plurality of word positions each connected to said set of output lines so that each of said word positions receives output signals on the same set of output lines of the OR matrix;

access means for the selective addressing of each word position in the random access memory one word position at a time; and control means including certain of said logic performing elements in said AND matrix means and said OR matrix means for controlling the access means in said selective addressing.

* * * * *